US008207609B2

(12) United States Patent
Ayotte et al.

(10) Patent No.: US 8,207,609 B2
(45) Date of Patent: Jun. 26, 2012

(54) OPTICALLY TRANSPARENT WIRES FOR SECURE CIRCUITS AND METHODS OF MAKING SAME

(75) Inventors: Stephen Peter Ayotte, Bristol, VT (US); Jeffrey Peter Gambino, Westford, VT (US); Timothy Dooling Sullivan, Underhill, VT (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/195,255

(22) Filed: Aug. 1, 2011

(65) Prior Publication Data

US 2011/0284280 A1    Nov. 24, 2011

Related U.S. Application Data

(62) Division of application No. 12/115,056, filed on May 5, 2008, now Pat. No. 8,017,514.

(51) Int. Cl.
*H01L 21/00* (2006.01)

(52) U.S. Cl. .................. 257/749; 438/4; 438/7; 438/16; 438/609

(58) Field of Classification Search .................. 257/749; 438/4, 7, 16, 609
See application file for complete search history.

(56) References Cited

U.S. PATENT DOCUMENTS

| 4,820,024 A | 4/1989 | Nishiura |
| 5,030,796 A | 7/1991 | Swanson et al. |
| 5,258,334 A | 11/1993 | Lantz, II |
| 5,478,971 A | 12/1995 | Gotou et al. |
| 5,936,261 A | 8/1999 | Ma et al. |
| 5,966,634 A | 10/1999 | Inohara et al. |
| 6,284,627 B1 | 9/2001 | Ramm et al. |
| 6,326,675 B1 | 12/2001 | Scott et al. |
| 6,410,413 B2 | 6/2002 | Scott et al. |
| 7,129,166 B2 | 10/2006 | Speakman |
| 7,166,515 B2 | 1/2007 | Clark, Jr. et al. |
| 7,619,693 B2 | 11/2009 | Fujioka et al. |
| 7,733,435 B2 | 6/2010 | Hirakata et al. |
| 7,773,182 B2 | 8/2010 | Kimura et al. |
| 2009/0141203 A1 | 6/2009 | Son et al. |
| 2010/0163851 A1* | 7/2010 | Buchel et al. ................... 257/40 |
| 2010/0237313 A1 | 9/2010 | Mikawa et al. |

OTHER PUBLICATIONS

Office Action (Mail Date Dec. 8, 2010) for U.S. Appl. No. 12/115,056, filed May 5, 2008, First Named Inventor Stephen Peter Ayotte.

(Continued)

*Primary Examiner* — Jarrett Stark
*Assistant Examiner* — Nicholas Tobergte
(74) *Attorney, Agent, or Firm* — Schmeiser, Olsen & Watts; Richard Kotulak

(57) ABSTRACT

A structure and a method. The method includes: forming a dielectric layer on a substrate; forming electrically conductive first and second wires in the dielectric layer, top surfaces of the first and second wires coplanar with a top surface of the dielectric layer; and either (i) forming an electrically conductive third wire on the top surface of the dielectric layer, and over the top surfaces of the first and second wires, the third wire electrically contacting each of the first and second wires, the third wire not detectable by optical microscopy or (ii) forming an electrically conductive third wire between the top surface of the dielectric layer and the substrate, the third wire electrically contacting each of the first and second wires, the third wire not detectable by optical microscopy.

14 Claims, 6 Drawing Sheets

OTHER PUBLICATIONS

Ex Parte Quayle Office Action (Mail Date Mar. 31, 2011) for U.S. Appl. No. 12/115,056, filed May 5, 2008, First Named Inventor Stephen Peter Ayotte.

Notice of Allowance (Mail Date May 9, 2011) for U.S. Appl. No. 12/115,056, filed May 5, 2008, First Named Inventor Stephen Peter Ayotte.

* cited by examiner

OPTICALLY TRANSPARENT WIRES FOR SECURE CIRCUITS AND METHODS OF MAKING SAME

The present application is a division of patent application Ser. No. 12/115,056 filed on May 5, 2008, now U. S. Pat. No. 8,017,514, issued Sep. 13, 2011.

RELATED APPLICATIONS

The present application is a division of patent application Ser. No. 12/115,056 filed on May 5, 2008.

FIELD OF THE INVENTION

The present invention relates to the field of integrated circuits; more specifically, it relates to optically transparent wires and the method of fabricating optically transparent wires for integrated circuits.

BACKGROUND OF THE INVENTION

As competition increases between manufacturers of integrated circuits, need to protect the proprietary information contained in the physical integrated circuit chip has increased, particularly in the view of the ability to reverse engineer integrated circuits using common failure analysis techniques such as de-layering and optical inspection. Many techniques have been described for preventing reverse engineering including self destructive chips. However, such a technique prevent routine failure analysis by the legitimate manufacturer. Accordingly, there exists a need in the art for a technique to increase the difficulty for reverse engineering integrated circuit chips while at the same time allowing routine failure analysis by the manufacturer.

SUMMARY OF THE INVENTION

A first aspect of the present invention is a method, comprising: (a) forming a dielectric layer on a substrate; (b) forming electrically conductive first and second wires in the dielectric layer, top surfaces of the first and second wires coplanar with a top surface of the dielectric layer; and (c) forming an electrically conductive third wire on the top surface of the dielectric layer, and over the top surfaces of the first and second wires, the third wire electrically contacting each of the first and second wires, the third wire not detectable by optical microscopy.

A second aspect of the present invention is a method, comprising: (a) forming a dielectric layer on a substrate; (b) forming electrically conductive first and second wires in the dielectric layer, top surfaces of the first and second wires coplanar with a top surface of the dielectric layer; and (c) forming an electrically conductive third wire between the top surface of the dielectric layer and the substrate, the third wire electrically contacting each of the first and second wires, the third wire not detectable by optical microscopy.

A third aspect of the present invention is a structure, comprising: a dielectric layer on a substrate; electrically conductive first and second wires in the dielectric layer, top surfaces of the first and second wires coplanar with a top surface of the dielectric layer; and an electrically conductive third wire on the top surface of the dielectric layer, and over the top surfaces of the first and second wires, the third wire electrically contacting each of the first and second wires, the third wire not detectable by optical microscopy.

A fourth aspect of the present invention is a structure, comprising: a dielectric layer on a substrate; an electrically conductive first and second wires in the dielectric layer, top surfaces of the first and second wires coplanar with a top surface of the dielectric layer; and an electrically conductive third wire between the top surface of the dielectric layer and the substrate, the third wire electrically contacting each of the first and second wires, the third wire not detectable by optical microscopy.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
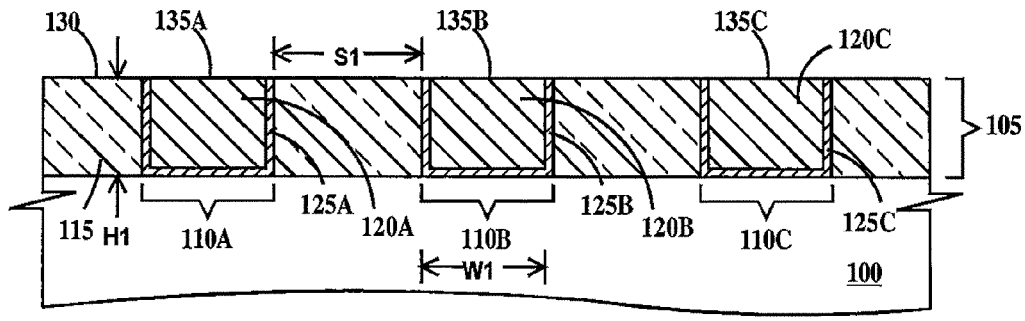
FIGS. 1A through 1E are cross-sectional drawings illustrating fabrication of an optically transparent wire according to a first embodiment of the present invention.

FIGS. 1A through 1E are cross-sectional drawings illustrating fabrication of an optically transparent wire according to a first embodiment of the present invention. In FIG. 1A, formed on an integrated circuit substrate 100 is a wiring level 105. Wiring level 105 includes wires 110A, 110B and 110C formed in a dielectric layer 115. Dielectric layer 115 may comprise a stack of two or more individual dielectric layers. Integrated circuit substrate 100 may include semiconductor devices such as field effect transistors, bipolar transistors, capacitors, resistors, inductors and diodes to which wires 110A, 110B and 110C may be connected. Additionally integrated circuit substrate may be include other wiring levels having wires formed in respective dielectric layers, these other wires connecting all or some of wires 110A, 110B and 110C to the semiconductor devices. In one example, each of wires 110A, 110B and 110C includes a respective electrically conductive core conductor 120A, 1120B and 120C having a respective electrically conductive liner 125A, 125B, 125C formed on sidewalls and a bottom surface of the corresponding core conductor. A top surface 130 of dielectric layer 115 is coplanar with top surfaces 135A, 135B and 135C of respective wires 110A, 110B and 110C. Top surfaces of core conductors 120A, 120B and 120C are exposed at respective top surfaces 135A, 135B and 135C of respective wires 110A, 110B and 110C.

In one example, each of liners 125A, 125B and 125C comprise a layer if tantalum nitride on a layer of tantalum, the tantalum abutting respective core conductors 120A, 120B and 120C. In one example, core conductors 120A, 120B and 120C each comprise copper. Wires 110A, 110B and 110C have a width W1, a height H1 and are spaced apart a distance S1. In one example, the ratio of H1/W1 is about equal to or greater than 1. In one example, the ratio of H1/W1 is between about equal to or greater than 1 and about less than or equal to 2. In one example, S1 is between about 50 nm and about 1000 nm.

Figure 1B:
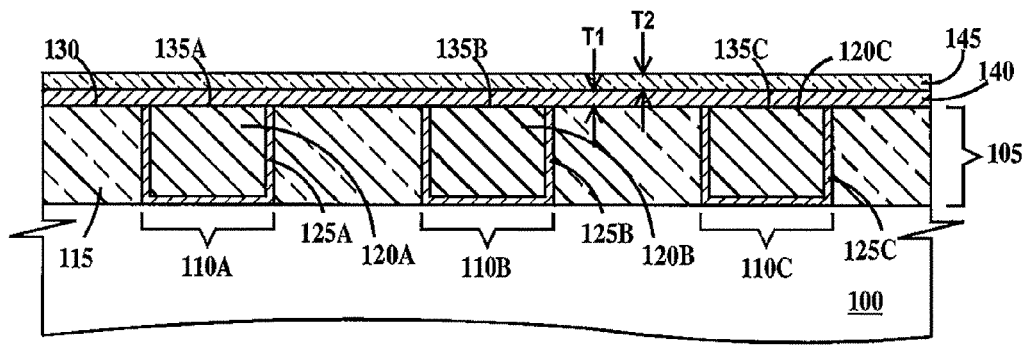

In FIG. 1B, an electrically conductive layer 140 is formed on a top surface 130 of dielectric layer 115 and on top surfaces 135A, 135B and 135C of respective wires 110A, 110B and 110C. A dielectric layer 145 is formed on a top surface of conductive layer 140. Conductive layer 140 has a thickness T1 and dielectric layer 145 has a thickness T2. In one example conductive layer 140 is formed by physical vapor deposition, examples of which include, but are not limited to, sputter deposition and evaporative deposition. In one example, dielectric layer 145 is formed by plasma enhanced chemical vapor deposition (PECVD). In one example, conductive layer 140 is a material selected from the group consisting of aluminum, tungsten, titanium, titanium nitride, tantalum, tantalum nitride, chromium and combinations thereof. In one example, dielectric layer 145 comprises silicon oxide, silicon nitride or a layer of silicon nitride over a layer of silicon oxide. In one example, a combination of the value of T1 and the material of conductive layer 140 are chosen to render the conductive layer not detectable by optical light microscopy (i.e., conductive layer 140 is transparent to wavelengths between about 400 nm and about 700 nm). In one example, T1 is between about 2 nm and about 10 nm. In one example, T1 is between about 2 nm and about 100 nm. In one example T2 is between about 2 nm and about 100 nm.

Figure 1C:
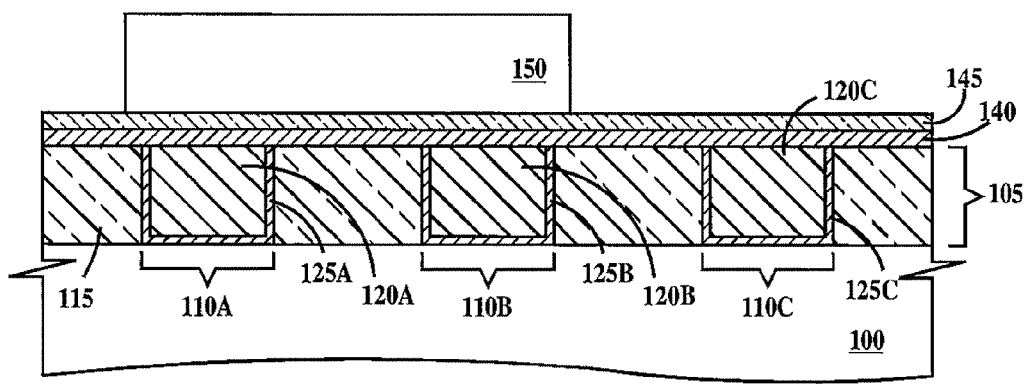

In FIG. 1C, a photoresist island 150 has been formed on dielectric layer 145 over wires 110A and 110B but not over wire 110C. Photoresist island 150 may be formed, by applying a layer of photoresist over dielectric layer 145, exposing the photoresist layer to actinic radiation through a patterned photomask, and developing away unexposed (for negative photoresist) or exposed (for positive photoresist) regions of the photoresist layer. The term photolithographically patterning is meant to include the steps of applying a photoresist layer, exposing the photoresist a material layer to actinic radiation through a patterned photomask to form a patterned photoresist layer, etching away the material layer not covered by said patterned photoresist layer and removing the photoresist layer.

Figure 1D:
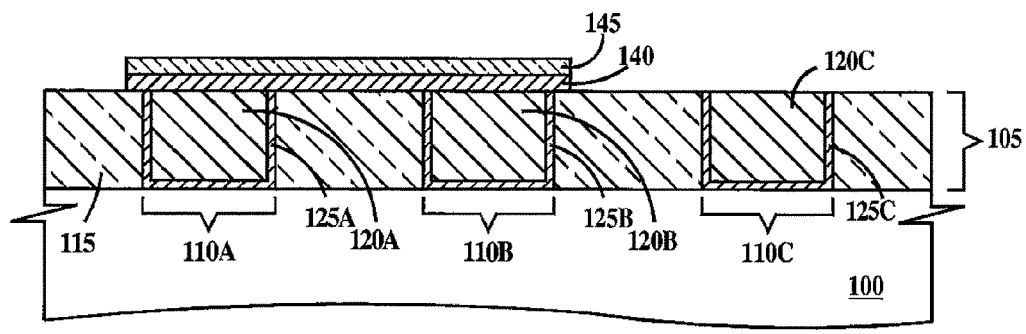

In FIG. 1D, regions of conductive layer 140 and dielectric layer 145 are etched away, for example by reactive ion etching (RIE), and photoresist island 150 (see FIG. 1E) removed to form a protective cap 145A over a conductive wire 140A. In the example that conductive layer 140 comprise tantalum, after dielectric layer 145 is etched, then conductive layer 140 may be etched in a RIE processing using chlorine based chemistry that is selective to silicon nitride and/or silicon oxide In FIG. 1C, photoresist island 150 extended past the perimeters of cores 120A and 120B of wires 110A and 110B. If cores 120A and 120B comprised copper, photoresist island 150 did not extend past the perimeters of cores 120A and 120B and a chlorine based RIE chemistry is used to etch conductive layer 140, then copper would be exposed to chlorine species during the RIE. In this case, the chorine based RIE is followed by a water clean or a hydrogen plasma clean.

Figure 1E:
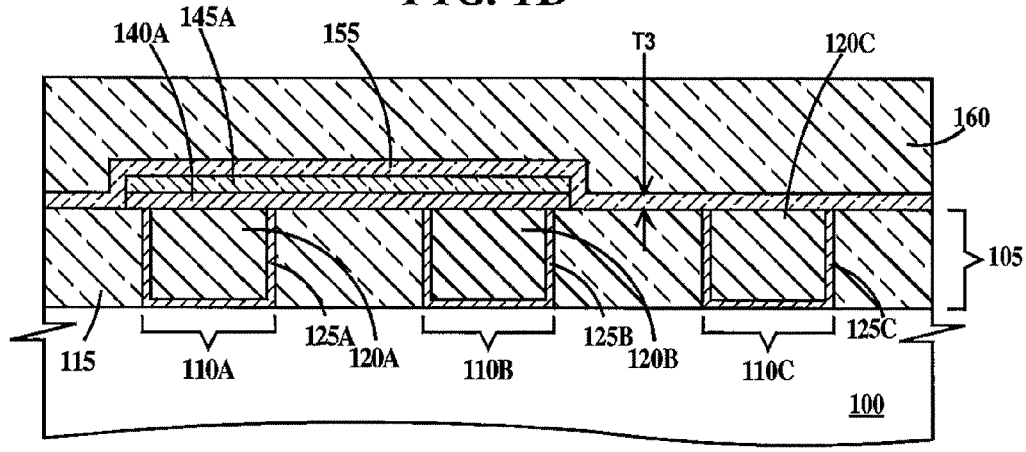

In FIG. 1E, a dielectric layer 155 is formed on exposed surfaces of dielectric layer 115, wire 110C and protective cap 145A and exposed edges of wire 140A. A dielectric layer 160 is formed on a top surface of dielectric layer 155. Dielectric layer 155 has a thickness T3. In one example, T3 is between about 10 nm and about 100 nm. In one example, dielectric layer 155 comprises silicon nitride or silicon carbide. In one example, dielectric layer 160 comprises high density plasma oxide or a low dielectric constant (low K) material having a permittivity of about equal to less than 2.4. Wire 145A electrically connects wire 110A to wire 110B. As discussed supra, because of the thinness and material of wire 145A, wire 145A is not visible when viewed in an optical microscope in the visible light spectrum of about 380 nm to about 750 nm. However, the current capacity of wire 145A is limited. Additional wires may now be formed in dielectric layers 115 and 160 connecting to some or all of wires 110A, 110B and 110C.

Figure 2:
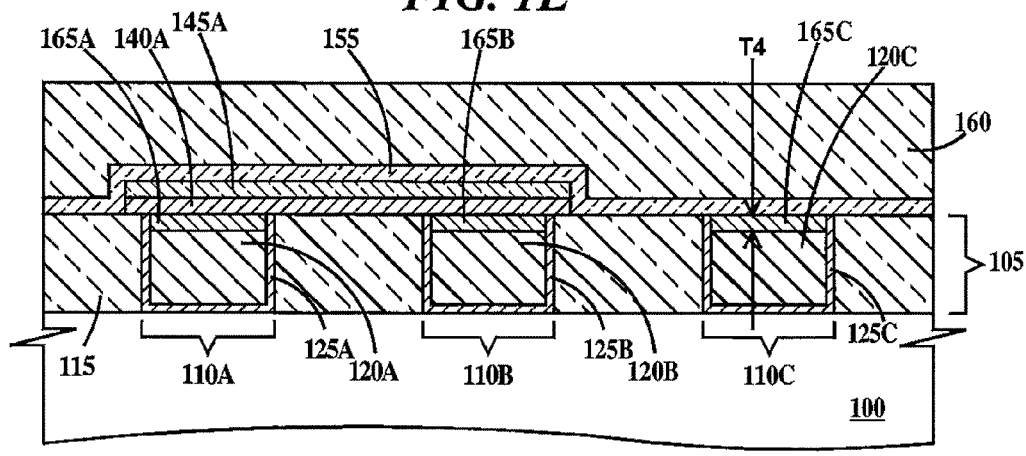
FIG. 2 is a cross-sectional drawing illustrating an optional feature for the first embodiment of the present invention.

FIG. 2 is a cross-sectional drawing illustrating an optional feature for the first embodiment of the present invention. FIG. 2 is similar to FIG. 1E, except barrier layers 165A, 165B and 165C have been formed on respective copper cores 120A, 120B and 120C proximate to top surface 130 of dielectric layer 115. In one example, barrier layers 165A, 165B and 165C are diffusion barriers to copper. In one example, each of barrier layers 165A, 165B and 165C comprises a material selected from the group consisting of cobalt (Co), nickel (Ni), tungsten (W), molybdenum (Mo), phosphorus (P), boron (B) and combinations thereof. In one example, each of barrier layers 165A, 165B and 165C comprises CoWP. In a first method, barrier layers 165A, 165B and 165C are formed by electroless plating. In a second method, barrier layers 165A, 165B and 165C are formed by selective chemical vapor deposition (CVD). In a third method, when cores 120A, 120B and 120C comprise copper, barrier layers 165A, 165B and 165C are formed by reacting the exposed surfaces of the cores to silane ($SiH_4$) to form copper silicide (CuSi) or to germane ($GeH_4$) to form copper germanide (CuGe). In a fourth method, barrier layers 165A, 165B and 165C are formed by a damascene process illustrated in FIG. 6A through 6D and described infra. FIG. 2 is illustrated using a barrier layer formed using the damascene process. The resultant structure of barrier layers 165A, 165B and 165C when formed using electroless plating, selective CVD are in illustrated in FIG. 5 and described infra.

Figure 3A:
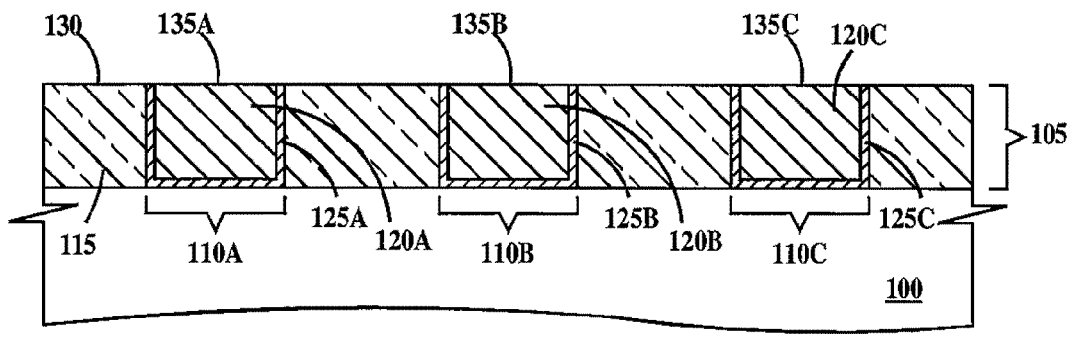
FIGS. 3A through 3E are cross-sectional drawings illustrating fabrication of an optically transparent wire according to a second embodiment of the present invention.
Figure 3B:
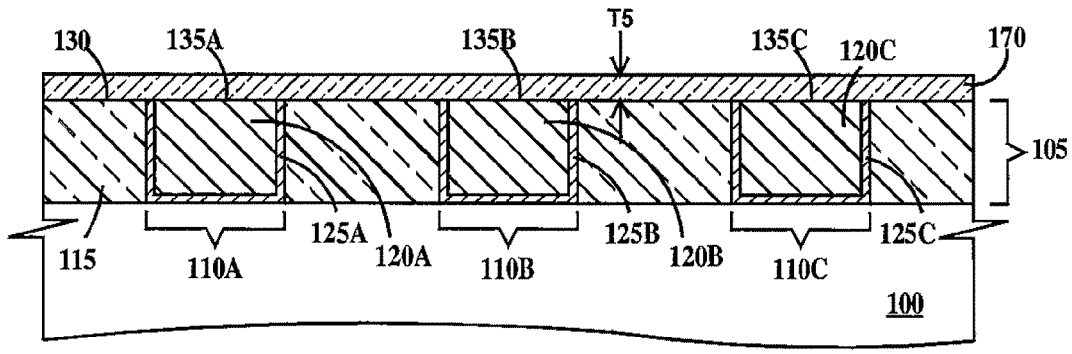

FIGS. 3A through 3E are cross-sectional drawings illustrating fabrication of an optically transparent wire according to a second embodiment of the present invention. FIG. 3A is similar to FIG. 1A. In FIG. 3B, a dielectric layer 170 is formed on a top surface 130 of dielectric layer 115 and on top surfaces 135A, 135B and 135C of respective wires 110A, 110B and 110C. Dielectric layer 170 has a thickness T5. In one example, dielectric layer 170 is formed by PECVD. In one example, dielectric layer 170 comprises silicon oxide, silicon nitride or a layer of silicon nitride over a layer of silicon oxide. In one example, T5 is between about 5 nm and about 25 nm.

Figure 3C:
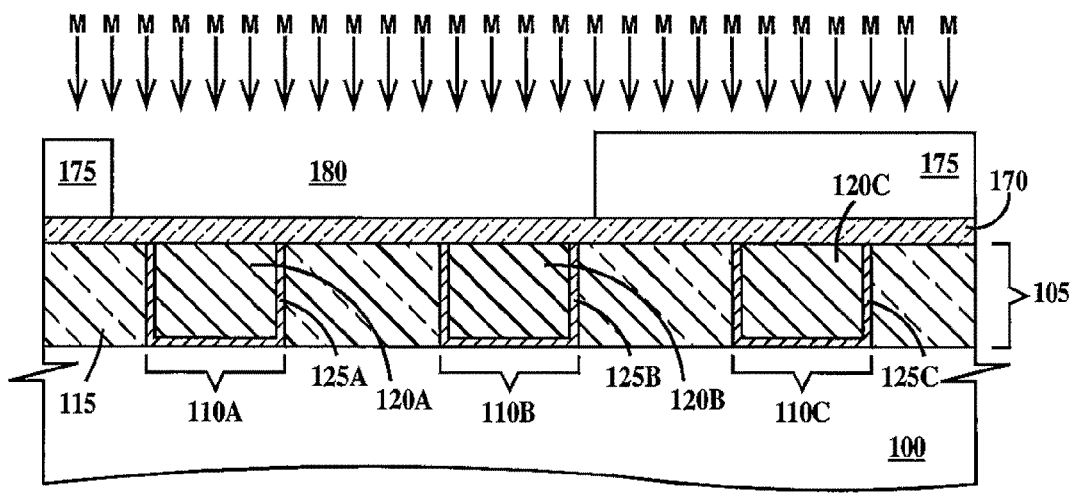

In FIG. 3C, a patterned photoresist layer 175 has been formed on dielectric layer 170 and an opening 180 exposed in the photoresist layer over wires 110A and 110B but not over wire 110C. Because of opening 180, regions of first and second wires 110A and 110B and a region of dielectric layer 105 (as well as a region of dielectric layer 170) are not covered by patterned photoresist layer 175. Photoresist layer 175 may be formed in a manner similar to that used described for forming photoresist layer 150 of FIG. 1C. An ion implantation of metal species M is performed, the photoresist layer 175 blocking ion implantation of species M. In one example the metal of species M is selected from the group consisting of tantalum, titanium, copper, and tungsten. In one example, the ion implantation dose is between about 1E15 atm/$cm^2$ and about 2E16 atm/$cm^2$. In one example, the ion implantation energy is between about 30 KeV and about 150 KeV.

Figure 3D:
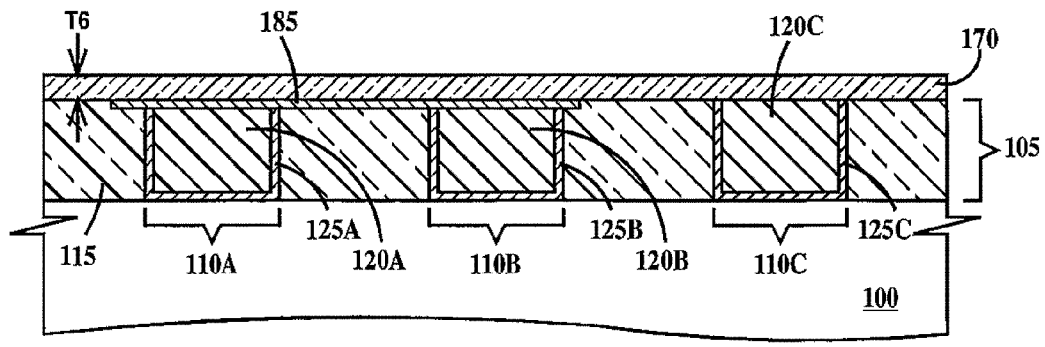

In FIG. 3D, photoresist layer 175 (see FIG. 3C) is removed and a wire 185 is formed electrically connecting wire 110A to wire 110B but not wire 110C. Wire 185 is illustrated as embedded wires 110A and 110B and in dielectric layer 115 between wires 110A and 110B proximate to the interface between dielectric layer 115 and dielectric layer 170. However, wire 185 may be embedded deeper into dielectric layer 115 so a layer of dielectric layer 115 intervenes between wire 185 and dielectric layer 170. Wire 185 has a thickness T6. In one example, wire 185 is a material selected from the group consisting of tungsten, titanium, copper and combinations thereof. In one example, a combination of the value of T6 and the material of conductive layer 170 are chosen to render the conductive layer not detectable by optical light microscopy (i.e., conductive layer 170 is transparent to wavelengths between about 400 nm and about 700 nm). In one example T6 is between about 2 nm and about 10 nm.

Figure 3E:
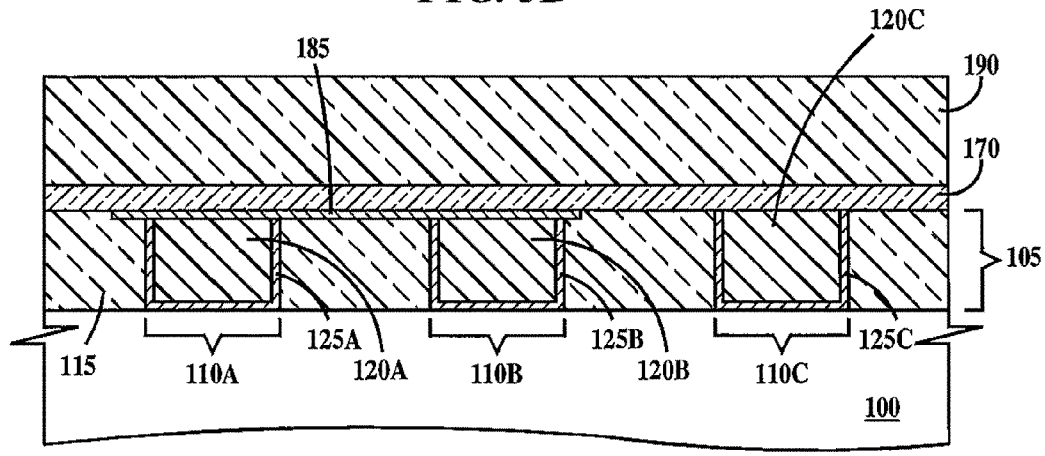

In FIG. 3E, a dielectric layer 190 is formed on a top surface dielectric layer 170. In one example, dielectric layer 190 comprises high density plasma (HDP) oxide or a low dielectric constant (low K) material having a permittivity of about equal to less than 2.4. In one example, HDP oxide is formed from mixture of oxygen and silane at a pressure of about 2 mTorr to about 10 mTorr in a plasma having an electron density of about 1E12/cm².

Wire 185 electrically connects wire 110A to wire 110B. As discussed supra, because of the thinness and material of wire 185, wire 185 is not visible when viewed in an optical microscope in the visible light spectrum of about 380 nm to about 750 nm. However, the current capacity of wire 185 is limited. Additional wires may now be formed in dielectric layers 170 and 190 connecting to some or all of wires 110A, 110B and 110C.

Figure 4:
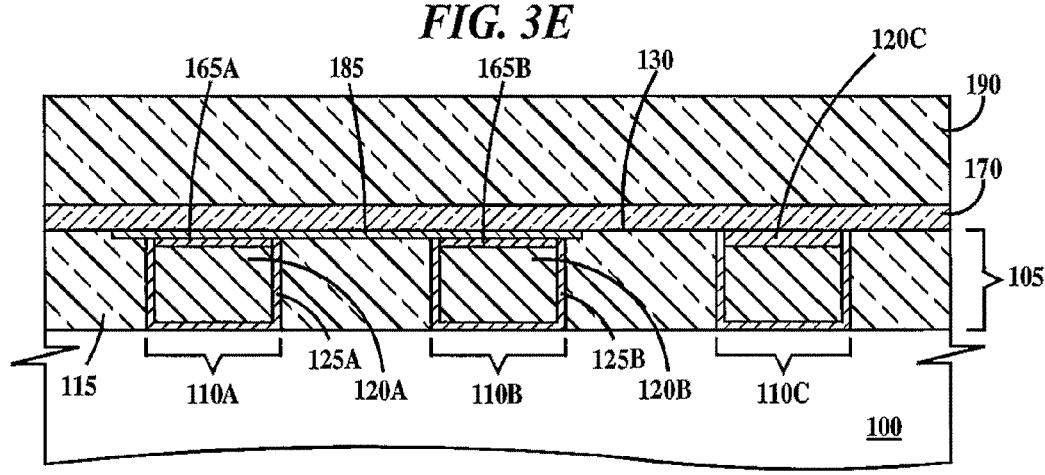
FIG. 4 is a cross-sectional drawing illustrating an optional feature for the second embodiment of the present invention.

FIG. 4 is a cross-sectional drawing illustrating an optional feature for the second embodiment of the present invention. FIG. 4 is similar to FIG. 3E, except barrier layers 165A, 165B and 165C have been formed on respective copper cores 120A, 120B and 120C proximate to top surface 130 of dielectric layer 115. Materials and method for forming barrier layers has been discussed supra in reference to FIG. 2. FIG. 4 is illustrated using a barrier layer formed using the damascene process.

Optical inspection of wires 110A, 110B and 110C in any of FIG. 1E, 2, 3E or 4 will should no connections between the wires, though wires 110A and 110B are electrically connected.

Figure 5:
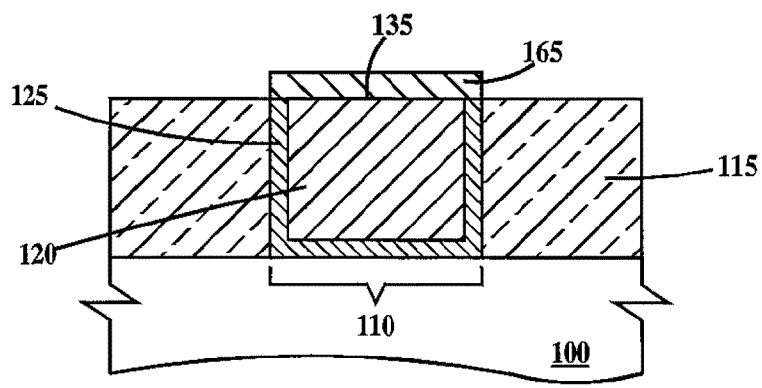
FIG. 5 illustrates first, second and third methods of forming the optional feature of FIGS. 2 and 4.

FIG. 5 illustrates first, second and third methods of forming the optional feature of FIGS. 2 and 4. In FIG. 5, barrier layer 165 is formed on top surface 135 of core conductor 1290, but as the barrier layer forms it overlaps liner 125.

Figure 6A:
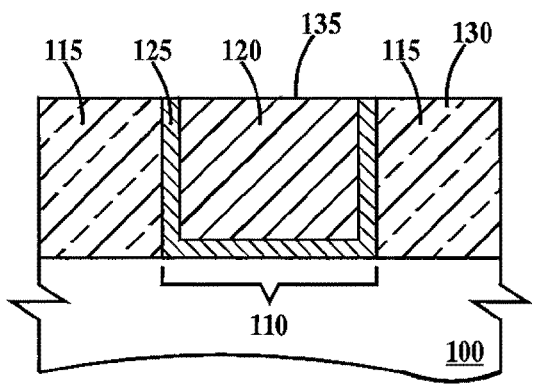
FIGS. 6A through 6D are cross-sectional drawings illustrating a fourth method of forming the optional feature of FIGS. 2 and 4.
Figure 6B:
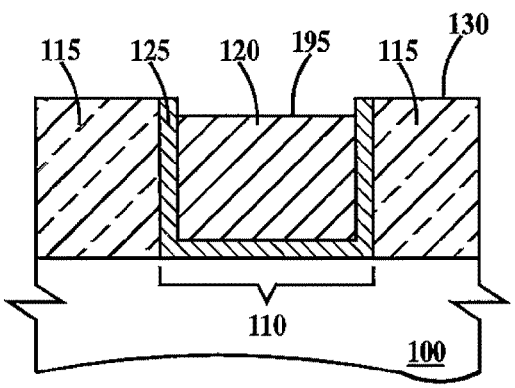
Figure 6C:
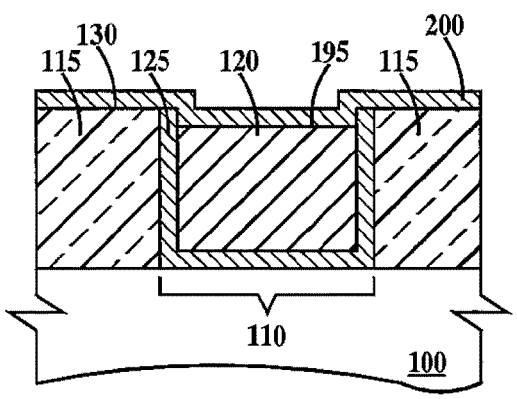
Figure 6D:
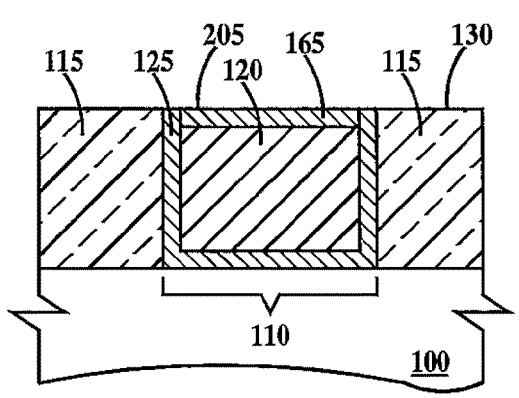

FIGS. 6A through 6D are cross-sectional drawings illustrating a fourth method of forming the optional feature of FIGS. 2 and 4. In FIG. 6A, top surface 135 of wire 110 is coplanar with top surface 130 of dielectric layer 115. In FIG. 6B, core conductor 120 has been recessed etch so a top surface 195 core conductor 120 is recessed below (i.e., in a direction toward substrate 100) top surface 130 of dielectric layer 115. In FIG. 6C, an electrically conductive layer 200 is formed by physical vapor deposition on top surface 130 of dielectric layer 115 and top surface 195 of core conductor 120 and completely filling or over filling the recess in core conductor 120. In FIG. 6D, a chemical mechanical polish (CMP) has been performed to remove all of conductive layer 200 (see FIG. 6C) from top surface 130 of dielectric layer 130 to form barrier layer 165. A top surface 205 of barrier layer 165 is coplanar with top surface 130 of dielectric layer 115.

Figure 7A:
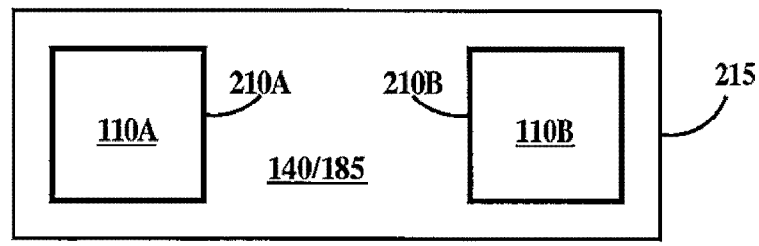
FIGS. 7A through 7E are plan views of various layouts of optically transparent wires according to the embodiments of the present invention.
Figure 7B:
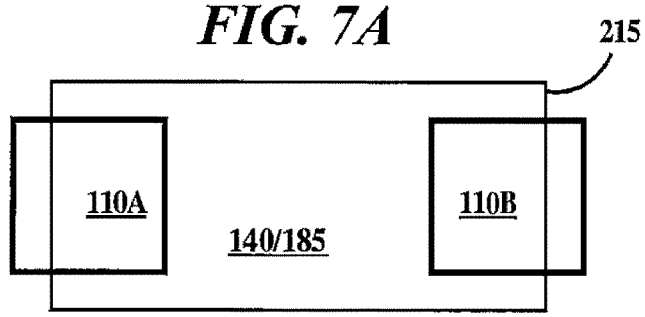
Figure 7C:
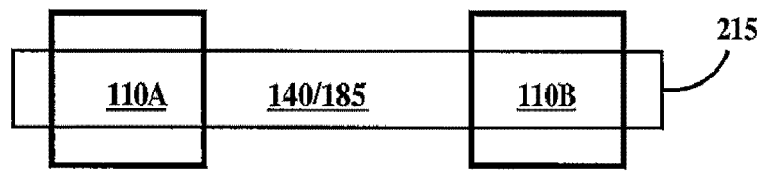
Figure 7D:
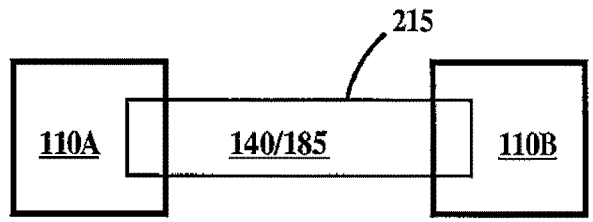
Figure 7E:
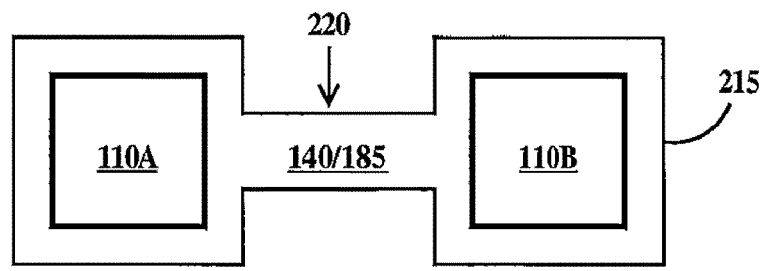

FIGS. 7A through 7E are plan views of various layouts of optically transparent wires according to the embodiments of the present invention. In FIG. 7A, perimeters of wires 110A and 110B are completely contained within a perimeter 215 of wire 140/185. In FIG. 7B, perimeter 215 of wire 140/185 overlaps three of the four edges of each of wires 110A and 110B. In FIG. 7C perimeter 215 of wire 140/185 overlaps two of the four edges of each of wires 110A and 110B. In FIG. 7D, perimeter 215 of wire 140/185 overlaps one of the four edges of each of wires 110A and 110B. In FIG. 7E, perimeters of wires 110A and 110B are completely contained within a perimeter 215 of wire 140/185, but wire 140/185 has a narrow region 220 between wires 110A and 110B.

It should be appreciated, that while the transparent wires of the embodiments of the present invention cannot be detected optically, this presents no problem to the manufacturer performing failure analysis, because the manufacturer knows where the transparent wires are. Thus the embodiments of the present invention provide structures and method of fabricating structures that increase the difficulty for reverse engineering integrated circuit chips while at the same time allowing routine failure analysis by the manufacturer.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
    a dielectric layer on an integrated circuit substrate said substrate including semiconductor devices, said dielectric layer having a bottom surface closet to said substrate and an opposite top surface furthest from said substrate;
    electrically conductive first and second wires in said dielectric layer, top surfaces of said first and second wires coplanar with a top surface of said dielectric layer; and
    an electrically conductive and patterned third wire on said top surface of said dielectric layer and on said top surfaces of said first and second wires, said third wire electrically contacting each of said first and second wires, said third wire not detectable by optical microscopy.

2. The structure of claim 1, wherein said third wire abuts said top surface of said first wire and said top surface of said second wire.

3. The structure of claim 1, wherein said first wire includes an electrically conductive first diffusion barrier layer and said second wire includes an electrically conductive second diffusion barrier layer, top surfaces of said first and second wires being coextensive with respective top surfaces of said first and second diffusion barrier layers and wherein said third wire abuts said top surfaces of said first and second diffusion barrier layers.

4. The structure of claim 1, wherein a combination of a material of said third wire and a thickness of said third wire render said third wire transparent to light having a wavelength between about 400 nm and about 700 nm.

5. The structure of claim 1, wherein said third wire has a thickness of between about 2 nm and about 10 nm.

6. The structure of claim 1, wherein (i) said third wire comprises a material selected from the group consisting of aluminum, tungsten, titanium, titanium nitride, tantalum, tantalum nitride, chromium and combinations thereof and (ii) said each of first and second wires include copper.

7. A structure, comprising:
   a dielectric layer on an integrated circuit substrate, said substrate including semiconductor devices, said dielectric layer having a bottom surface closet to said substrate and an opposite top surface furthest from said substrate;
   an electrically conductive first and second wires in said dielectric layer, top surfaces of said first and second wires coplanar with a top surface of said dielectric layer; and
   an electrically conductive and patterned third wire, said third wire formed in said dielectric layer, said third wire electrically contacting each of said first and second wires, said third wire not detectable by optical microscopy.

8. The structure of claim 7, wherein said third wire abuts said first wire and said second wire.

9. The structure of claim 7, wherein said first wire includes an electrically conductive first diffusion barrier layer and said second wire includes an electrically conductive second diffusion barrier layer, top surfaces of said first and second wires being coextensive with respective top surfaces of said first and second diffusion barrier layers and wherein said third wire abuts said first and second diffusion barrier layers.

10. The structure of claim 7, wherein a combination of a material of said third wire and a thickness of said third wire render said third wire transparent to light having a wavelength between about 400 nm and about 700 nm.

11. The structure of claim 7, wherein said third wire has a thickness of between about 2 nm and about 10 nm.

12. The structure of claim 7, wherein (i) said third wire comprises a material selected from the group consisting of tungsten, titanium, copper and combinations thereof and (ii) each of said first and second wires include copper.

13. A structure, comprising:
   a dielectric layer on substrate;
   electrically conductive first and second wires in said dielectric layer, top surfaces of said first and second wires coplanar with a top surface of said dielectric layer;
   an electrically conductive third wire on said top surface of said dielectric layer and over said top surfaces of said first and second wires, said third wire electrically contacting each of said first and second wires, said third wire not detectable by optical microscopy; and
   wherein said first wire includes an electrically conductive first diffusion barrier layer and said second wire includes an electrically conductive second diffusion barrier layer, top surfaces of said first and second wires being coextensive with respective top surfaces of said first and second diffusion barrier layers and wherein said third wire abuts said top surfaces of said first and second diffusion barrier layers.

14. A structure, comprising:
   a dielectric layer on a substrate;
   an electrically conductive first and second wires in said dielectric layer, top surfaces of said first and second wires coplanar with a top surface of said dielectric layer;
   an electrically conductive third wire between said top surface of said dielectric layer and said substrate, said third wire electrically contacting each of said first and second wires, said third wire not detectable by optical microscopy; and
   wherein said first wire includes an electrically conductive first diffusion barrier layer and said second wire includes an electrically conductive second diffusion barrier layer, top surfaces of said first and second wires being coextensive with respective top surfaces of said first and second diffusion barrier layers and wherein said third wire abuts said top surfaces of said first and second diffusion barrier layers.

* * * * *